(12) United States Patent
Gronland et al.

(10) Patent No.: US 8,336,314 B2
(45) Date of Patent: Dec. 25, 2012

(54) METHOD OF MANUFACTURING A NOZZLE ARRANGEMENT AND METHOD FOR IN-SITU REPAIRING A NOZZLE ARRANGEMENT

(75) Inventors: Tor-Arne Gronland, Sollentuna (SE); Pelle Ransten, Storvreta (SE); Hakan Johansson, Uppsala (SE); Johan Bejhed, Uppsala (SE)

(73) Assignee: NanoSpace AB, Uppsala (SE)

( * ) Notice: Subject to any disclaimer, the term of this patent is extended or adjusted under 35 U.S.C. 154(b) by 909 days.

(21) Appl. No.: 12/439,749

(22) PCT Filed: Sep. 4, 2007

(86) PCT No.: PCT/SE2007/050615
§ 371 (c)(1),
(2), (4) Date: Mar. 3, 2009

(87) PCT Pub. No.: WO2008/030175
PCT Pub. Date: Mar. 13, 2008

(65) Prior Publication Data
US 2010/0139239 A1 Jun. 10, 2010

(30) Foreign Application Priority Data

Sep. 4, 2006 (SE) ...................................... 0601832

(51) Int. Cl.
*B64G 1/40* (2006.01)
*F03H 99/00* (2009.01)
(52) U.S. Cl. ........ 60/777; 60/200.1; 60/203.1; 219/543; 392/398; 29/611; 29/620; 29/890.01; 29/402.18; 29/402.01; 427/229; 427/252
(58) Field of Classification Search ............... 60/200.1, 60/202, 203.1, 206, 39.822, 723, 777; 219/520, 219/523, 532, 538, 542, 543, 544, 546, 548, 219/552; 392/386, 387, 391, 396, 397, 398
See application file for complete search history.

(56) References Cited

U.S. PATENT DOCUMENTS
1,967,757 A * 7/1934 Losee .......................... 392/365
(Continued)

FOREIGN PATENT DOCUMENTS
GB 2396595 6/2004
(Continued)

OTHER PUBLICATIONS
Mechanical Engineers' Handbook, Edited by Kutz, M., Second Edition, John Wiley & Sons, Inc., 1998, pp. 1383-1385.*
(Continued)

*Primary Examiner* — Ehud Gartenberg
*Assistant Examiner* — Lorne Meade
(74) *Attorney, Agent, or Firm* — Young & Thompson

(57) ABSTRACT

A nozzle arrangement for use in a gas thruster is presented. At least one heater micro structure (20) is arranged in a stagnation chamber (12) of the gas thruster. The heater microstructure (20) comprises a core of silicon or a silicon compound coated by a surface metal or metal compound coating. The heater microstructure (20) is manufactured in silicon or a silicon compound and covered by a surface metal coating. The heater microstructure (20) is mounted in the stagnation chamber (12) before or after the coverage of the surface metal or metal compound coating. The coverage is performed by heating the heater microstructure and flowing a gas comprising low quantities of a metal compound. The compound decomposes at the heated heater microstructure (20), forming the surface metal or metal compound coating. The same principles of coating can be used for repairing the heater microstructure (20) in situ. The driving gas comprises preferably a compound exhibiting an exothermic reaction when coming into contact with a catalytically active material. If the gas is exposed to heater microstructures being covered with the catalytically active material, the gas is further heated by the catalytic reaction.

6 Claims, 11 Drawing Sheets

U.S. PATENT DOCUMENTS

| | | | | |
|---|---|---|---|---|
| 2,988,430 | A * | 6/1961 | Horner | 422/630 |
| 4,220,846 | A * | 9/1980 | Rice et al. | 392/488 |
| 4,523,429 | A * | 6/1985 | Bingley | 60/203.1 |
| 4,620,415 | A * | 11/1986 | Schmidt | 60/219 |
| 4,733,056 | A * | 3/1988 | Kojima et al. | 219/543 |
| 5,431,737 | A * | 7/1995 | Keller et al. | 118/729 |
| 5,519,191 | A * | 5/1996 | Ketcham et al. | 219/552 |
| 6,351,006 | B1 * | 2/2002 | Yamakawa et al. | 257/310 |
| 6,762,310 | B2 * | 7/2004 | Neumann et al. | 549/523 |
| 6,779,335 | B2 * | 8/2004 | Herdy, Jr. | 60/205 |
| 6,893,765 | B1 * | 5/2005 | Nishida et al. | 429/481 |
| 6,908,873 | B2 * | 6/2005 | Zhou et al. | 502/29 |
| 2002/0023427 | A1 | 2/2002 | Mojarradi | |
| 2002/0166922 | A1 | 11/2002 | Robinson | |
| 2004/0031885 | A1 * | 2/2004 | D'Ausilio et al. | 244/172 |
| 2004/0131904 | A1 * | 7/2004 | Arthur et al. | 429/26 |
| 2005/0257515 | A1 | 11/2005 | Song | |
| 2007/0074501 | A1 * | 4/2007 | Oren | 60/203.1 |

FOREIGN PATENT DOCUMENTS

| | | |
|---|---|---|
| SE | 527154 | 1/2006 |
| WO | 2004098994 | 11/2004 |

OTHER PUBLICATIONS

International Search Report dated Dec. 12, 2007, in PCT application.

* cited by examiner

METHOD OF MANUFACTURING A NOZZLE ARRANGEMENT AND METHOD FOR IN-SITU REPAIRING A NOZZLE ARRANGEMENT

TECHNICAL FIELD

The present invention relates in general to spacecraft propulsion systems for micro and nano spacecrafts, and in particular to devices and methods associated with gas thruster arrangements.

BACKGROUND

Spacecraft based applications of all kinds have increased over the last years. In particular, the interest for micro- and nano-satellites has increased, since the costs for launching can be significantly reduced by launching a large number of spacecraft simultaneously. This is achieved by reducing mass and volume of spacecraft.

One particular field in space science concerns propulsion and maneuverability of the spacecraft or parts thereof. For microspacecraft, the forces needed to perform certain propulsion and/or maneuvers are relatively limited, whereby also the propulsion systems themselves can be made very small. Typical forces are in the $\mu N$ to mN ranges. One particular approach for propulsion is to use the momentum of gas streaming out from an opening. This approach is suitable for precision control of advanced space systems as well as a primary propulsion method for miniaturized satellites, where low mass, volume and power consumption are important driving criterions.

In a traditional setup, a cold gas thruster is utilized. Gas in a high-pressure tank is allowed to escape through a stagnation chamber and a nozzle. The existence of the nozzle increases the speed, and thereby the momentum, of the gas exiting the gas thruster. A recoil action will drive the thruster, and any device attached thereto in an opposite direction.

In the Swedish patent SE 527 154, a gas thruster system is disclosed, where the gas, when passing the stagnation chamber is heated by internal heaters before entering into the nozzle. Since the momentum of the gas increases by the square root of the gas temperature, a much higher propulsion efficiency of the stored gas can be obtained. Furthermore, by using the laminar flow of the gas through the stagnation chamber, a very high temperature can be achieved in the middle of the gas stream while keeping the gas coming into direct contact with the chamber and nozzle walls at a lower temperature. Mean gas temperatures can in such a way be allowed to exceed the maximum operation temperature of the chamber and nozzle walls. In one embodiment of SE 527 154, a cylindrical heater coil of diamond-like carbon (DLC) has been used. The coils were manufactured by use of laser chemical vapour deposition techniques.

One problem with high-efficiency gas thruster systems according to prior art is that the complexity for manufacturing and mounting heaters is large. In order, not to reduce the reliability of the operation of such systems, the manufacturing becomes very time consuming as well as expensive. Another problem with high-efficiency gas thruster systems according to prior art is that the heater arrangements are sensitive to wear and/or corrosion. Furthermore, there is a general need for further improving robustness as well as efficiency.

SUMMARY

A general object of the present invention is therefore to provide improved gas thrusters, improved manufacturing methods thereof and improved operation thereof. A further object is to provide heater arrangements for gas thrusters that are easier to manufacture in a reliable manner. Another further object is to provide heater arrangements for gas thrusters that are possible to tune or repair in situ. Yet another further object is to provide more efficient gas thrusters.

The above objects are achieved by devices and methods according to the enclosed patent claims. In general words, a nozzle arrangement for use in a gas thruster is presented, having a stagnation chamber with an entrance opening and a nozzle exit. At least one heater microstructure is arranged in the stagnation chamber. The heater microstructure comprises a heater microstructure core of silicon or a silicon compounds coated by a surface metal or metal compound coating. A manufacturing method is presented where a stagnation chamber having an entrance opening and a nozzle exit is provided. A heater microstructure is manufactured in silicon or a silicon compound and covered by surface metal or metal compound coating. The heater microstructure is mounted in the stagnation chamber before or after the coverage of the surface metal coating. The coverage is performed by heating the heater microstructure, preferably by conducting an electric current therethrough and flowing a gas comprising low quantities of a metal or metal compound over the heater microstructure. Other coating techniques, such as evaporation, sputtering or plating, are also possible. The compound decomposes at the heated heater microstructure, forming the surface metal or metal compound coating. The same principles of coating can be used for repairing the heater microstructure in situ. In operation, gas is released from a container. The gas comprises preferably a compound exhibiting an exothermic reaction or volume expansion reaction when coming into contact with a catalytically active material. If the gas is exposed to heater microstructures being covered with the catalytically active material, the gas is further heated by the catalytically activated exothermic reaction.

One advantage with the present invention is that an easier and more reliable manufacturing is enabled. This leads in turn to less expensive manufacturing costs. Another advantage is that new principles of operating, using the reactivness of the driving material, can be employed, which increases the efficiency of using the stored driving material.

BRIEF DESCRIPTION OF THE DRAWINGS

The invention, together with further objects and advantages thereof, may best be understood by making reference to the following description taken together with the accompanying drawings, in which.

DETAILED DESCRIPTION

Throughout the present disclosures, equal or directly corresponding features in different figures and embodiments will be denoted by the same reference numbers.

Figure 1A:
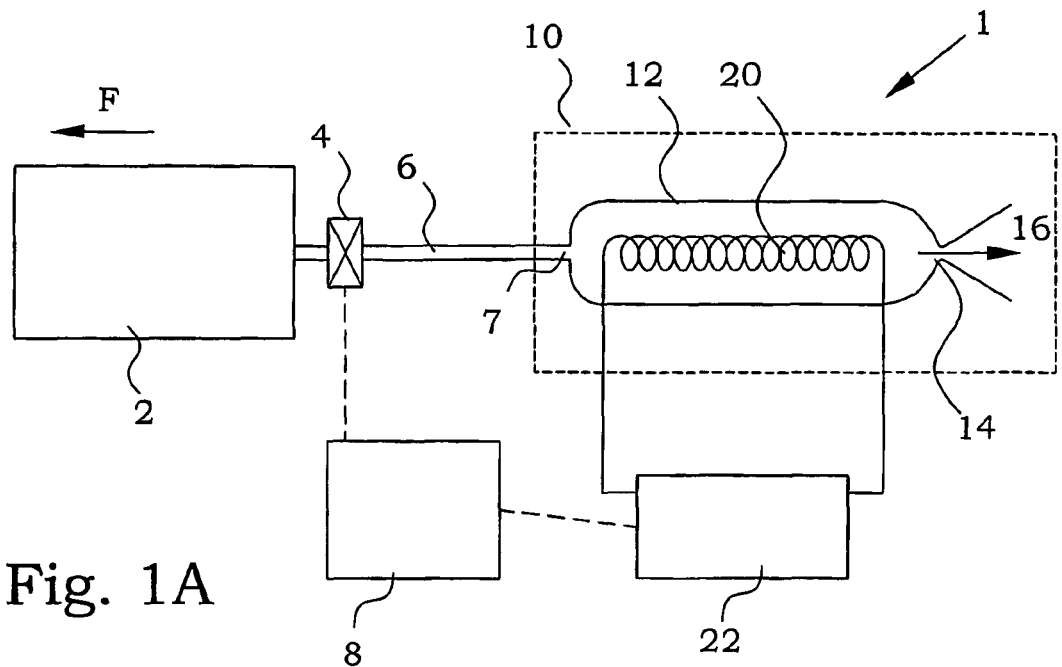
FIG. 1A is a schematic drawing of a gas thruster.

FIG. 1A illustrates schematically an embodiment of a gas thruster 1, operating with heating of the gas. The gas thruster 1 comprises a container containing driving material, in the present embodiment a gas storage 2, typically capable of storing gas under high pressure. A valve arrangement, in the present embodiment a gas valve 4 regulates the flow of gas from the gas storage 2, through an inlet pipe 6, to a nozzle arrangement 10. The gas valve is typically controlled by a flow control unit 8. The nozzle arrangement 10 in turn comprises a stagnation chamber 12 in an entrance opening 7 of which the inlet pipe 6 discharges. The opposite side of the stagnation chamber 12 is formed as a nozzle exit 14 in order to increase the speed and thereby the momentum of the gas 16 exiting the stagnation chamber 12. The stagnation chamber 12 further comprises a heater microstructure 20, in this embodiment depicted as a heater coil, which heats the gas within the stagnation chamber and thereby increases the efficiency of the gas flowing out from the gas storage 2. The heater microstructure 20 is controlled by a heater control unit 22, preferably connected to the flow control unit 8 for adapting the power inserted into the gas as heat, depending on the gas flow rate. The gas thruster 1 of FIG. 1A can thereby apply a force to any device mechanically coupled to the gas thruster directed in an opposite direction F to the direction 16 of the gas streaming out from the gas thruster 1.

In FIG. 1A, only one heater microstructure 20 is illustrated. It is also possible to use a multitude of heater microstructures 20 in one and the same stagnation chamber. In such a case, the different heater microstructures may also be possible to operate independently of each other, which allows for further control of the temperature distribution within the stagnation chamber.

Figure 1B:
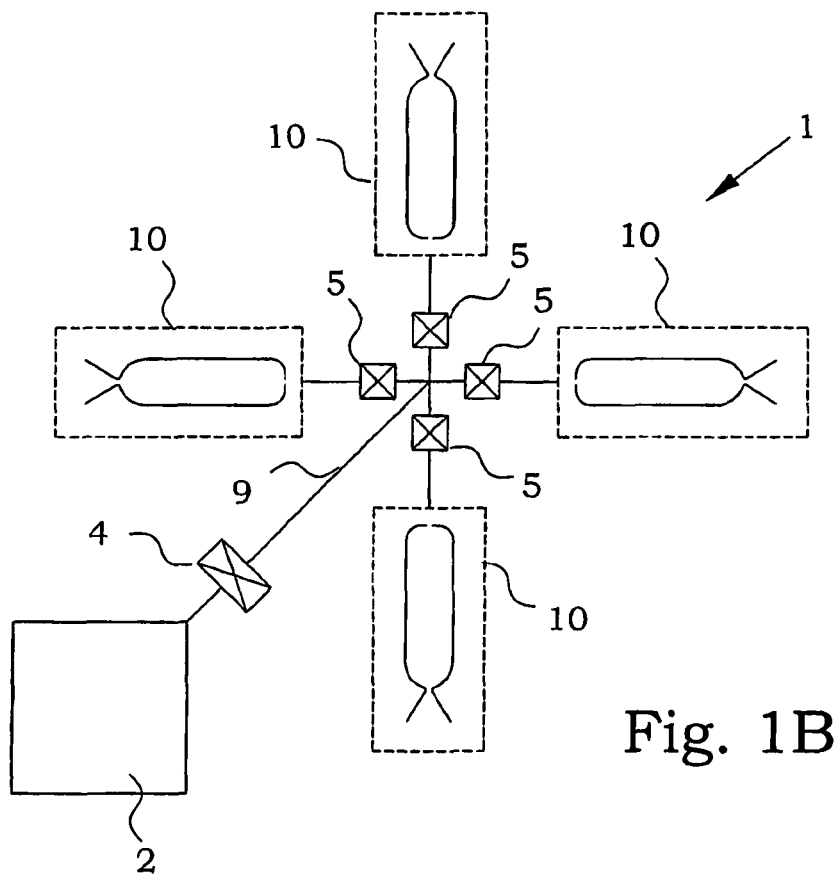
FIG. 1B is a schematic drawing of another gas thruster, having multiple nozzle arrangements.

FIG. 1B illustrates another embodiment of a gas thruster 1, having four nozzle arrangements 10 arranged in four perpendicular directions. All four nozzle arrangements 10 are connected through a main gas pipe 9 to one and the same gas storage 2, via a main valve 4. However, in order to operate each nozzle arrangement more or less independently of each other, separate valves 5 are provided on the inlet pipe 6 to each nozzle arrangement 10. Such a gas thruster 1 has a maneuvering capability in any direction within a plane.

The nozzle arrangement 10 is typically created using MEMS (Micro Electro Mechanical System) technology. The stagnation chamber is thereby typically realised as a cavity in a silicon wafer, using different etching techniques to create the shapes of e.g. the nozzle. In SE 527 154, it was concluded that despite the manufacturing advantages of silicon, the material has certain drawbacks. It was stated that silicon looses its good mechanical properties at high temperatures. Already at 1000 K, the mechanical strength is reduced and the material melts at 1680 K. The use of silicon for forming the stagnation chamber walls and nozzle is cumbersome, since the wish is to heat the gas flowing through the stagnation chamber. However, in SE 527 154 it was shown that by using internal heaters and relying on the heat isolation provided by a laminar flow, the requirements for the stagnation chamber walls could be relaxed.

One embodiment in SE 527 154 disclosed coil heaters made of diamond-like carbon. However, as mentioned above, the manufacturing and mounting thereof is difficult, and the carbon may easily be oxidized by trace amounts of oxygen in the gas flow. The chemical resistance can be improved somewhat by coating the coil with tungsten.

According to the present invention, the proposed solution goes in the totally opposite direction. Instead of discussing the need for rejecting silicon as a construction material, the present invention even uses a material based on silicon, i.e. silicon or a silicon compound, as the basic part of the internal heat arrangement. The main disadvantage of using silicon as construction material is the reduction in mechanical strength at elevated temperatures. However, by providing a core of silicon or silicon compound by a surface metal coating, several advantages can be provided. The material based on silicon could be selected from e.g. pure low-resistivity silicon or fully or partly oxidized silicon. In cases where the material based on silicon presents too low a conductivity, the metal coating also serves as an electrical conductor.

First, the metal coating provides mechanical strength to the composite heater microstructure. The silicon core can thereby be used even at temperatures relatively close to the melting point. Furthermore, the metal cover may also additionally serve as an oxidation protection for the silicon material, in particular if relatively inert metals are used. The surface metal coating is thereby more resistant to corrosive environments. The largest advantage of using silicon as the original construction material is that there are well-established techniques within the MEMS for manufacturing of small objects with very accurate shapes and dimensions. This is discussed more in detail further below. The geometrical forming of the core structure can thereby be achieved by relatively simple means.

Once the core structure of the material based on silicon is formed, the surface metal coating is formed onto the core structure. This provided by deposition of metal onto the core structure, e.g. by means of Chemical Vapour Deposition (CVD) or similar techniques. In many cases, the deposition is enhanced at elevated temperatures, and if pure silicon is used, the core structure can be heated by sending a current through the core structure. Preferred embodiments of the deposition are discussed more in detail further below.

Figure 2A:
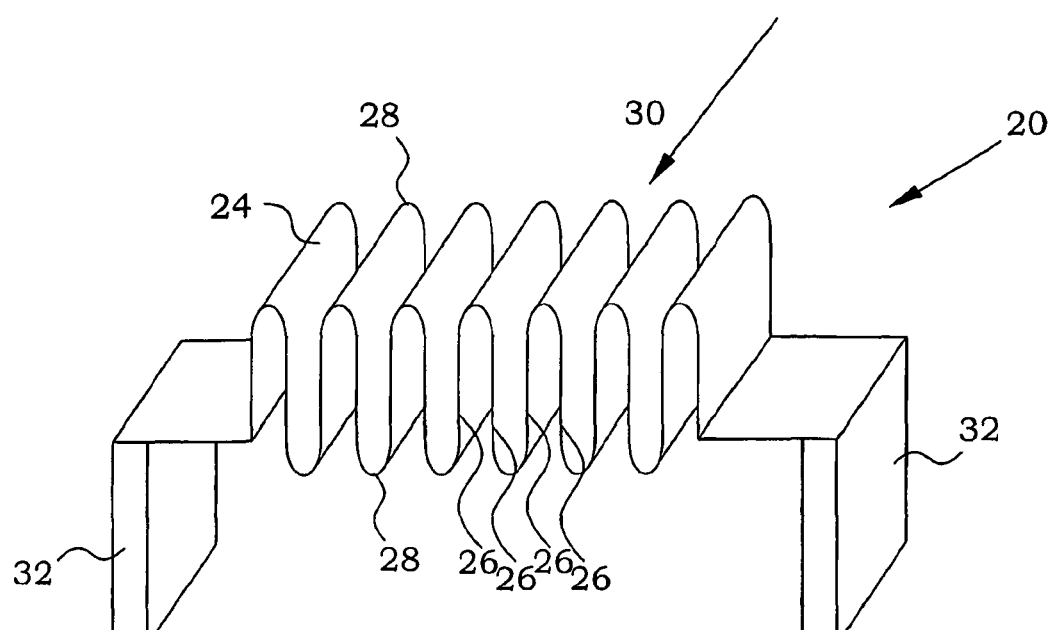
FIG. 2A is a schematic drawing of an embodiment of a heater microstructure according to the present invention.

FIG. 2A illustrates an embodiment of a heater microstructure 20 according to the present invention. The heater microstructure 20 comprises in this embodiment a thin heater sheet structure 24, formed in a meandering shape. The heater sheet 24 thereby presents a number of essentially parallel sheet segments 26, mechanically connected at opposite ends 28 to neighbouring sheet segments 26. The heater microstructure 20 is intended to be placed in a stagnation chamber with the parallel sheet segments 26 parallel to the direction 30 of the gas streaming through the stagnation chamber. The heater microstructure 20 of the present embodiment comprises two electrical connections 32 arranged at opposite ends of the heater sheet structure 24 in order to be able to provide an electrical current therethrough.

Figure 2B:
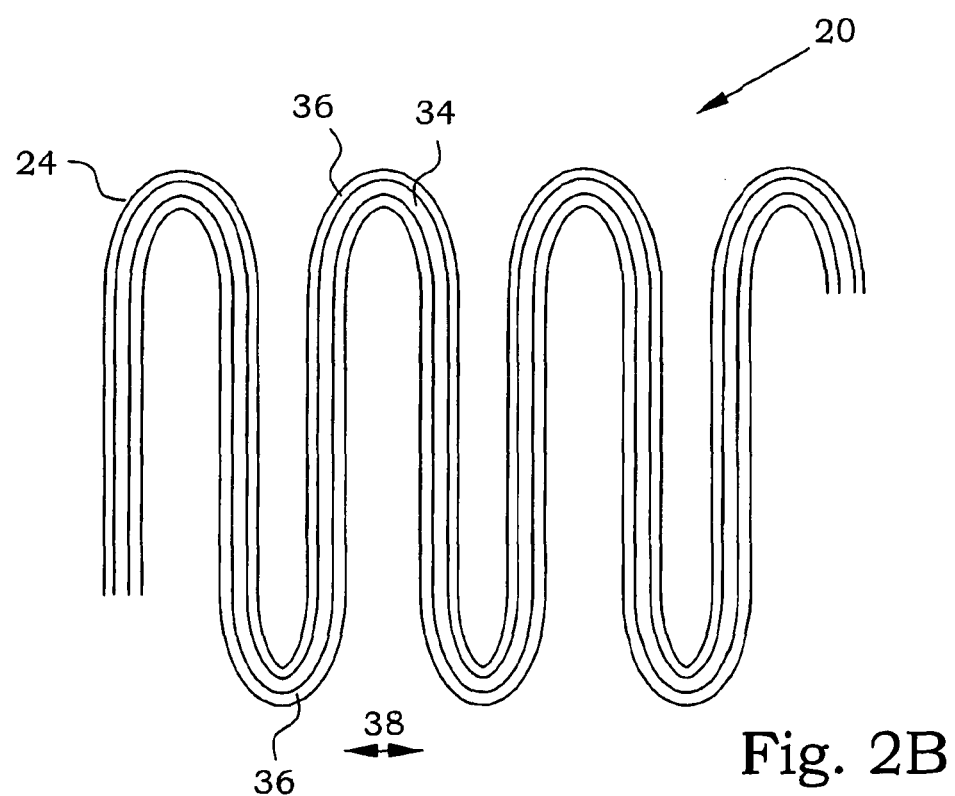
FIG. 2B is a cross sectional view of the embodiment of FIG. 2A.

In FIG. 2B, a cross-section of a part of the heater microstructure of FIG. 2A is illustrated. The heater microstructure 20 comprises a core structure 34 of low resistance silicon, and a surface metal or metal compound coating 36. In the present embodiment, the surface metal coating 36 comprises platinum metal, but other metals are also possible to use. In particular, refractory metals, such as tungsten, are attractive due to their high melting point. However, in certain applications, where catalytic properties are requested, metals such as W, Pd Ir, Rh or Pt or mixtures thereof may be preferable. Also oxides, nitrides and carbides of W, Ir, Rh, Pd and Pt are possible. This aspect is discussed further below. In the present embodiment, the thickness of the silicon core structure 34 is about 15 μm, the thickness of the platinum coating 36 is about 5 μm and the spacing 38 between two successive sheet segments is around 25 μm.

Figure 2C:
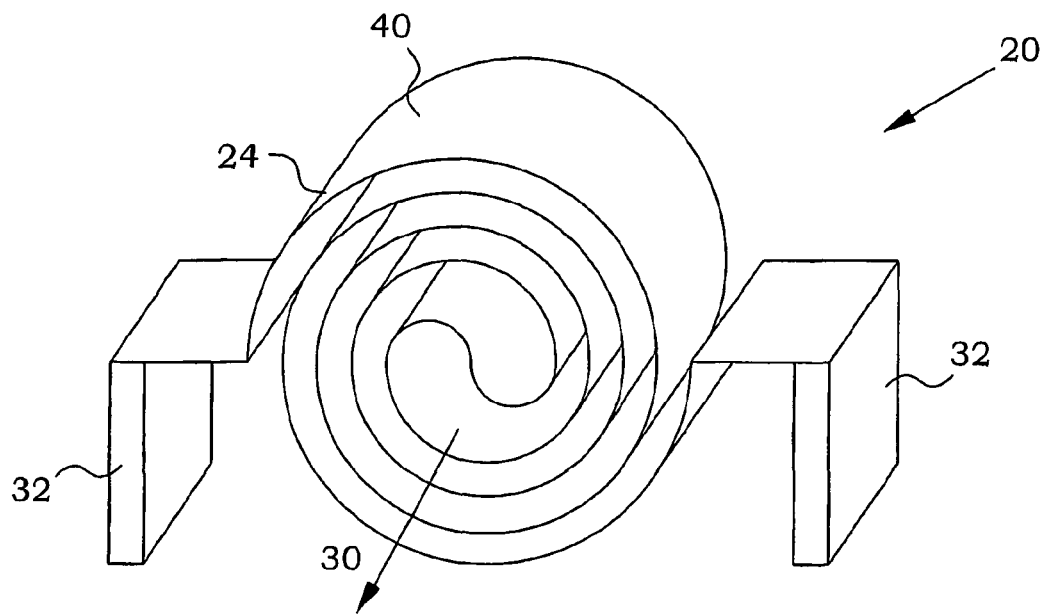
FIG. 2C is a schematic drawing of another embodiment of a heater microstructure according to the present invention.

In FIG. 2C, another embodiment of a heater microstructure 20 according to the present invention is illustrated. Here, the structure is also based on a thin heater sheet structure 24. However, in this embodiment, the structure is created in a structure forming a spiral tube shape 40. This enhances the heating of the gas flowing inside the spiral tube 40, thus reducing the heat load on the walls of the stagnation chamber.

Figure 2D:
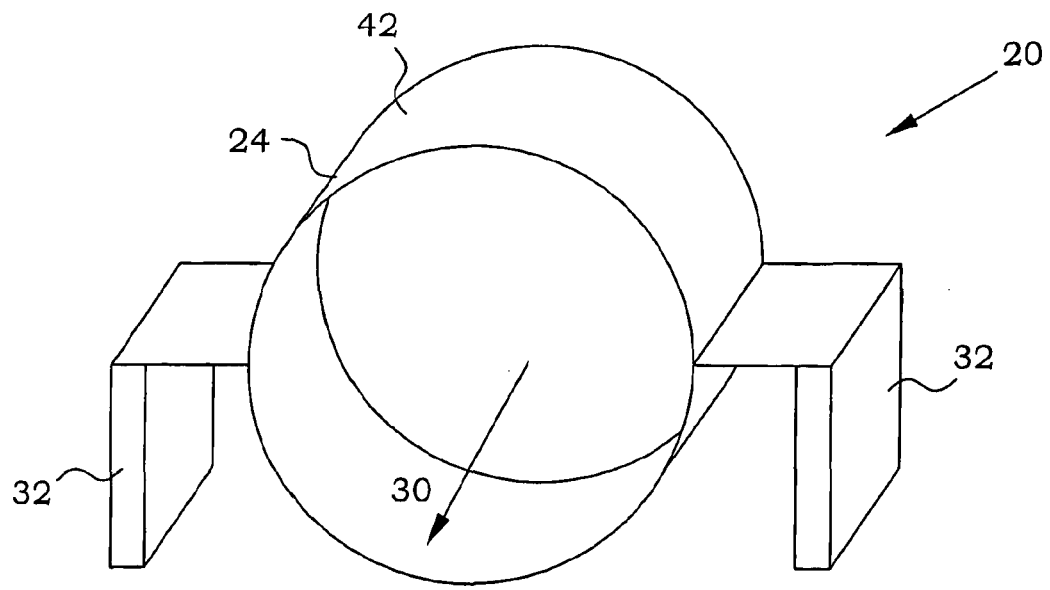
FIG. 2D is a schematic drawing of yet another embodiment of a heater microstructure according to the present invention.

In FIG. 2D, yet another embodiment of a heater microstructure 20 according to the present invention is illustrated. Here, a tube 42 is created by the thin heater sheet structure 24 and provided with electrical connections 32 at opposite ends. Such a structure resembles the coil structure used in prior art, giving a similar heat transfer to the gas flow. However, this embodiment has the disadvantage that the thin heater sheet structure 24 has to be created very thin, in order to increase the resistance enough to give reasonable heat dissipation from the tube 42.

As anyone skilled in the art understands, the heater microstructure 20 may be shaped in many other shapes also. A common feature is, however, that thin heater sheet structures 24 are used, having a relatively large contact area with the streaming gas. The thin heater sheet structure 24 has preferably a width in a direction towards the nozzle exit that is considerably larger, preferably more than at least one order of magnitude larger, than a thickness of the thin heater sheet structure 24. The thin heater sheet structures 24 has a core structure 34 of a material based on silicon, e.g. low resistivity silicon or a silicon compound, covered by a thin surface metal or metal compound coating 36.

Figure 3A:
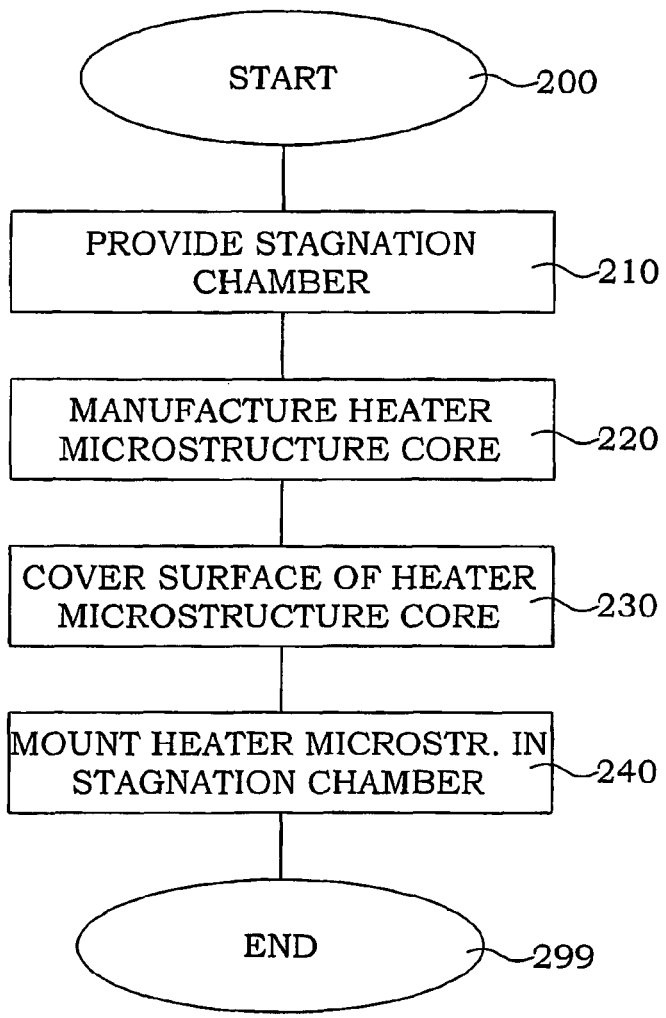
FIG. 3A is a flow diagram of main steps of an embodiment of a manufacturing method according to the present invention.

FIG. 3A illustrates a flow diagram of main steps of an embodiment of a manufacturing method according to the present invention. The procedure starts in step 200. In step 210, a stagnation chamber is provided, and in step 220, a heater microstructure core is manufactured. Steps 210 and 220 are preferably performed by MEMS, giving silicon based geometrical structures. However, other manufacturing approaches according to prior art can also be used with the main principles of present invention, since the particular way in which the stagnation chamber and the heater microstructure core are produced are not of any crucial importance.

MEMS is traditionally based mainly on single crystalline silicon. The procedures were originally developed by the integrated circuit industry, but due to the attractive patterning properties, mechanical arrangements are easily manufactured by similar processes.

A typical procedure starts with creating a mask layer on a silicon wafer. First, a photo resist in liquid form is spun onto the wafer. The resist is solidified by a soft baking procedure, typically by placing the wafer on a hot plate until the solvent is evaporated. The wafer is covered and aligned with a lithography mask having the requested structures, and the wafer is exposed for UV light. The photo resist exposed for the UV light changes its properties, while the areas covered by the mask are unchanged. The mask is removed and the wafer is developed in a bath with a chemical developer, which removes either the exposed or unexposed areas of the photo resist, depending on the type used. The wafer is coated with an etch mask material. The remaining photo resist, together with the etch mask material covering the resist is removed, leaving an etch mask having the same structures as the original lithography mask. The non-covered areas are exposed for etching. Depending on the requested geometrical shapes, different kinds of wet or dry etching processes, anisotropic or isotropic, can be utilised. For enabling creation of flat vertical walls, dry etching is typically employed. Reactive Ion Etching (RIE), sputter etching and vapour phase etching are examples of dry etching techniques. For the embodiments illustrated in the present invention, RIE has been employed. However, as anyone skilled in the art, the present invention is not dependent on the very specific etching method used, which is why other dry and wet etching techniques can be used. The etching removes silicon that is not covered by the etching mask (and for some methods also some material under the etching mask), and the requested three-dimensional geometrical structures are developed.

Step 210 is preferably performed by etching two wafers with complementary geometrical cavities. The wafers are thereafter bonded together to form the stagnation chamber as a combined cavity between the wafers. Note, however, that such a method requires that at least step 220 is performed prior to the bonding.

Step 220 is also preferably performed by means of MEMS. However, as mentioned earlier, other production methods giving similar geometrical structures may be utilized. The cross-section pattern of the thin heater sheet structure is thereby provided on the wafer, and the etching is allowed to continue through the entire wafer. In this way, the width of the thin heater sheet structure becomes equal to the original thickness of the silicon wafer. In this way, it is possible to manufacture almost any geometrical structure having a constant cross section along the width of the structure.

Figure 3B:
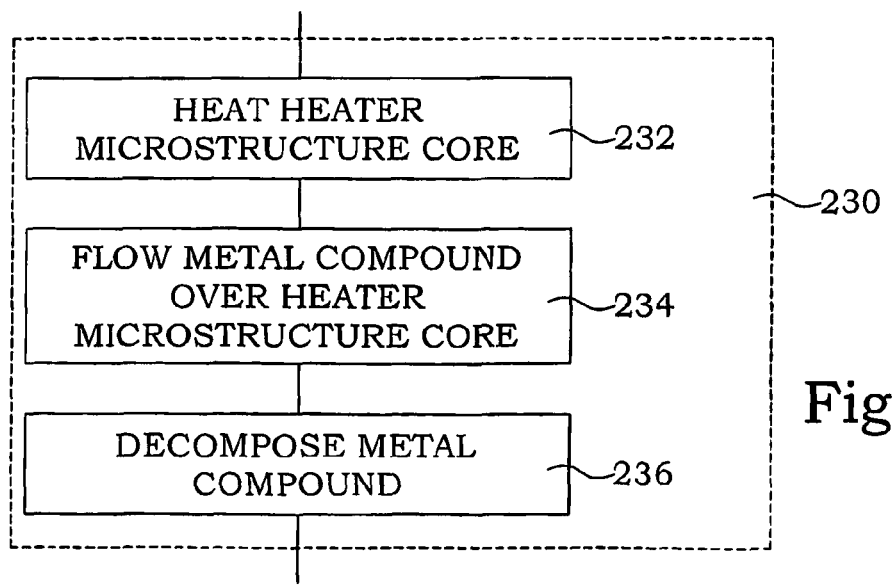
FIG. 3B is a flow diagram of steps of a part process of FIG. 3A.

In step 230, the heater microstructure core is covered by a surface metal coating. This can preferably be performed by vacuum deposition techniques, e.g. CVD. One embodiment of step 230 is illustrated in more detail in FIG. 3B. The heater microstructure core is heated in step 232. This can be performed in different ways, e.g. by irradiating the heater microstructure core by laser radiation. However, a simple solution is to use the heater microstructure core itself by sending a current through the heater microstructure core, thereby creating resistive heating. In step 234, gas comprising low quantities of a metal compound is flown over the heater microstructure core. In step 236, the gas coming into contact with the heated heater microstructure core will decompose, and metal or metal compound will form on the heater microstructure core successively building the surface metal or metal compound coating.

A metal compound, known for metal deposition as such, is $W_6F$. When the tungsten hexaflouride comes into contact with a hot body, in the presence of hydrogen gas, the following reaction takes place:

$$W_6F + 3H_2 \rightarrow W(s) + 6HF(g)$$

In other words, tungsten is deposited at the surface, while HF leaves the surface in gaseous state. The process becomes more pronounced at higher temperatures, which means that hotter surfaces achieve a thicker deposition. When heating the heater microstructure core resistively, a relatively thick deposited metal layer will decrease the local resistance, and the generated heat will thus locally decrease. This is of use during the deposition process, since areas with a thinner coating will be somewhat hotter than areas with thicker coating, which means that the differences in coating thickness will be reduced, since the deposition rate is higher at the hotter spots.

Also oxides, nitrides, carbides of W, Ir, Rh, Pd and Pt are possible to use as surface coatings.

When a suitably thick surface metal or metal compound coating is achieved, the deposition is ended.

The heater microstructure is in step 240 mounted in the stagnation chamber. (Note here, that if the stagnation chamber is formed by a wafer bonding process as described above, part of step 210 will take place after the mounting of the heater microstructure.) The procedure ends in step 299.

Figure 3C:
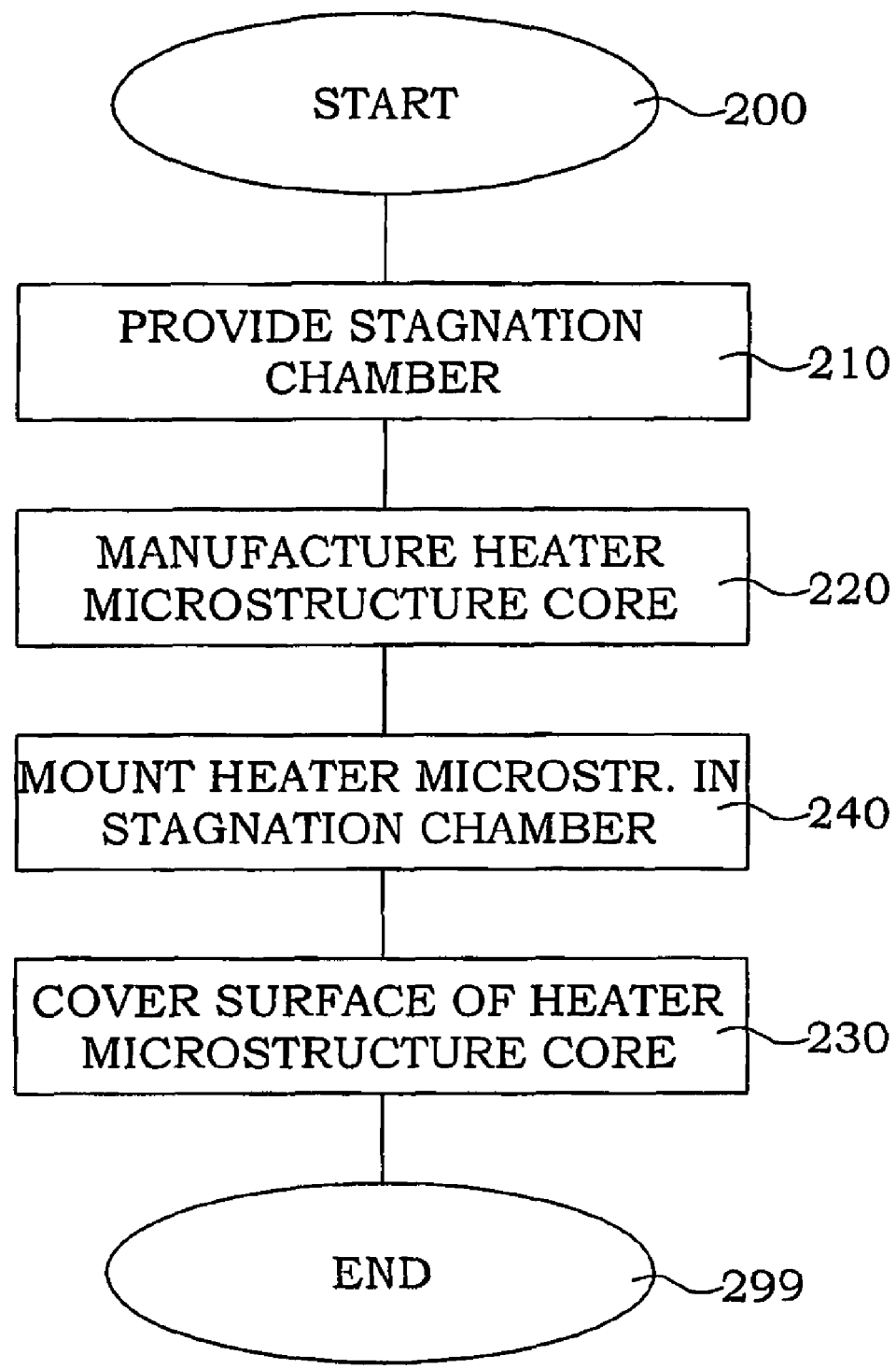
FIG. 3C is a flow diagram of main steps of another embodiment of a manufacturing method according to the present invention.

The surface metal coating step is possible to perform in a dedicated vacuum chamber. However, in a preferred embodiment, the covering step 230 can be performed in situ, directly on a heater microstructure core already mounted in the stagnation chamber. FIG. 3C illustrates such a method. Here, the process begins with the steps 210 and 220 in the same way as in FIG. 3A. However, in the embodiment of FIG. 3C, the step of mounting 240 follows before any surface metal or metal compound coating is performed, i.e. before step 230. Also here, if the stagnation chamber is formed by a wafer bonding process as described above, part of step 210 will take place after the mounting 240 of the heater microstructure in the stagnation chamber. When the mounting and any wafer bonding step is performed, the covering step 230 can be performed in situ, inside the stagnation chamber. A suitable gas is provided through the inlet to the stagnation chamber, and by connecting a current through the heater microstructure connections, the heater microstructure core is heated, and deposition takes place.

This process has certain advantages. First, no separate chambers are needed for the covering process, which saves mounting time and reduces any possibilities to break the relatively fragile heater microstructure cores. Secondly, during the mounting process, the resistance conditions of the connections will always be changed, sometimes more, sometimes less. By monitoring the resistance over the heater microstructure before the covering step, compensations can be made due to the differing contacting resistances. Furthermore, by following the resistance during the deposition, the degree of deposition can be controlled in a very accurate manner by interrupting the heating step or the flowing step, whereby an in situ resistance tuning is achieved. The homogeneity of the surface metal coating is typically not a large problem, due to the self-evening of the coating described above.

When the covering step 230 is completed it would even be possible to etch away at least a part of the silicon or silicon compound forming the heater microstructure core, thus using the silicon or silicon compound merely as a sacrificial structure.

Figure 4A:
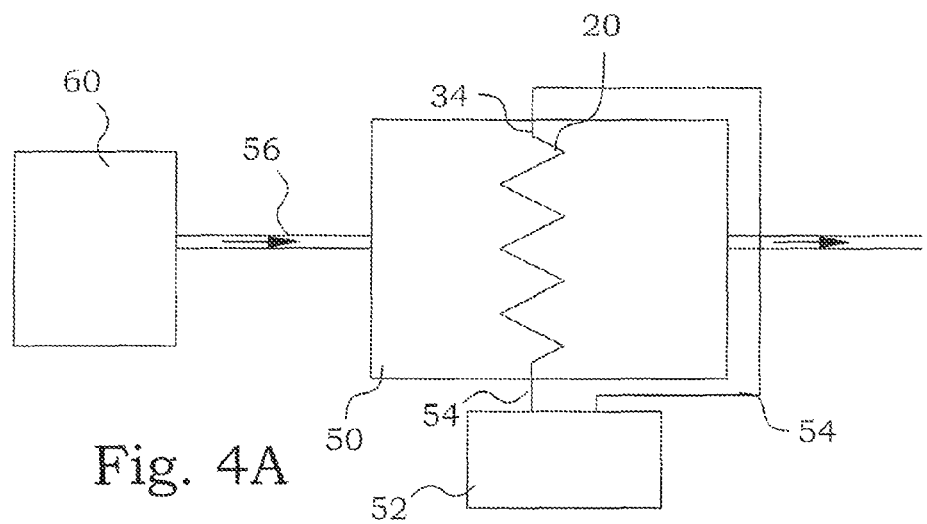
FIG. 4A is a schematic drawing of an embodiment of a manufacturing equipment according to the present invention.

FIG. 4A illustrates a set-up for metal covering of a heater microstructure core 34 forming a heater microstructure 20. The heater microstructure core 34 is mounted in a deposition chamber 50, and connections 54 are connecting the heater microstructure core 34 to a deposition control unit 52 comprising a controlled current source. Gas comprising metal compounds is stored in a coating container, in this embodiment a metallizing gas storage 60 and flows 56 into the deposition chamber 50. When a current is applied through the heater microstructure core 34, the heater microstructure core 34 becomes heated and the metal compounds decompose at the surface. The remaining gas exits from the deposition chamber 50. The deposition control unit 52 preferably also comprises functionalities monitoring the development of the resistance over the building-up heater microstructure 20, in order to interrupt the deposition when a suitably thick coating has been achieved.

Figure 4B:
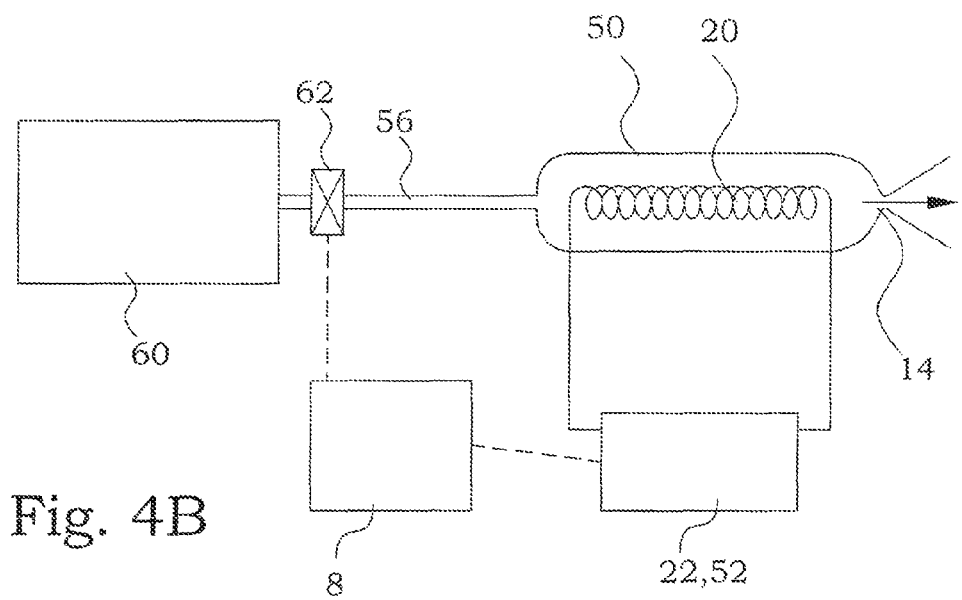
FIG. 4B is a schematic drawing of another embodiment of a manufacturing equipment according to the present invention.

FIG. 4B illustrates a set-up for in situ covering of a heater microstructure core 34. The deposition chamber 50 is here constituted by the stagnation chamber 12. The metallizing gas storage 60 is connected to the inlet pipe 6 via a valve 62. After deposition, the metallizing gas storage 60 can be disconnected. Alternatively, the metallizing gas storage 60 can temporarily replace the gas storage 2, whereby the extra valve 62 can be omitted. The deposition control unit 52 may likewise be a separate unit or may include also the heater control unit 22.

Figure 4C:
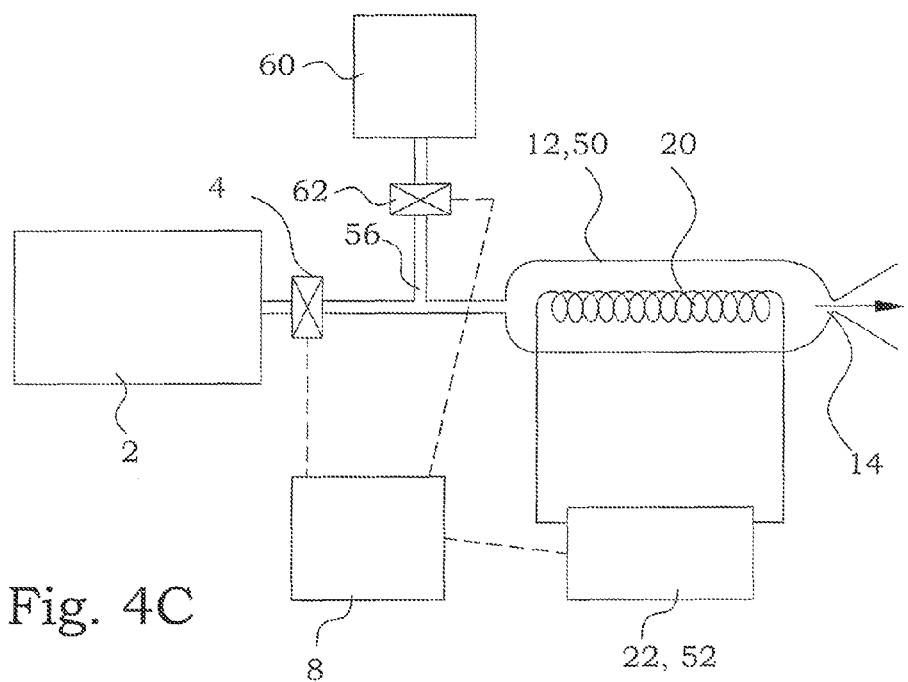
FIG. 4C is a schematic drawing of an embodiment of a gas thruster allowing in situ repairing according to the present invention.

FIG. 4C illustrates a set-up for in situ covering of a heater microstructure 20, arranged to be operated even in parallel with the ordinary driving operation. Since all parts are present for both covering and driving, such a set-up can be utilized e.g. for performing repairs of the surface metal coating in situ, and even in parallel with or interleaved between operation periods. If a heater microstructure 20 is corroded during use, e.g. due to impurities in the gases used for the driving action, the heater microstructure 20 can in fact be repaired. Metal compound containing gas is flowed through the stagnation chamber 12 while the heater microstructure 20 is heated. Due to the high resistance at spots with thin surface metal coating, these spots becomes hotter and the decomposition of the metal compound occurs faster at these spots, until the requested thickness is regained.

Figure 5:
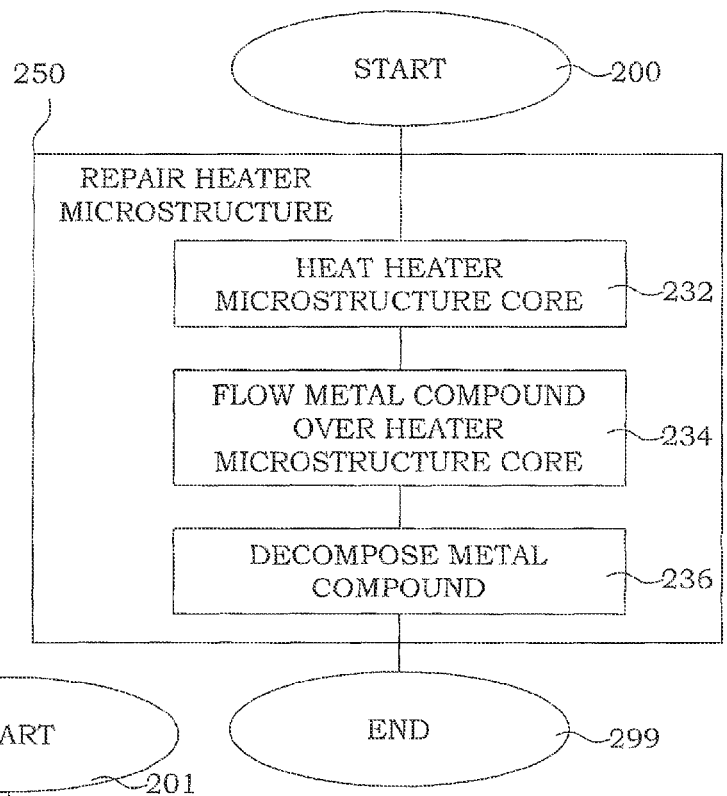
FIG. 5 is a flow diagram of main steps of an embodiment of a repairing method according to the present invention.

FIG. 5 illustrates the repair aspect as a flow diagram. The procedure starts in step 200. In step 250, the surface metal coating of the heater microstructure is improved. This step in turn comprises the steps 232, 234 and 236, known from FIG. 3B. The procedure ends in step 299. The resemblance with the original manufacturing is obvious, since it is the result of one and the same inventive idea.

The gas used in the repair of the heater microstructure can even be further used for driving the gas thruster.

A gas thruster according to the present invention can basically be utilized in a similar manner as conventional gas thrusters. However, as will be described here below, gas thrusters according to the present invention have certain advantages. In a basic version, the container containing driving material is a conventional gas storage, comprising pressurized gas, e.g. $H_2$, He, Ne, $N_2$, Ar, Xe, $CF_4$, $CH_4$, $NH_3$, $N_2O$, $C_3H_8$ or $C_4H_{10}$, preferably $N_2$, Xe, $CH_4$, $NH_3$ or $N_2O$. It is important that the gas is as pure as possible, since even small amounts of impurities may contribute to corrosion of the heater microstructure and stagnation chamber.

Furthermore, since volume reduction is important in space applications, it would be even better to utilise a gas that can be liquidized when exposed to high pressures, e.g. Xe, $N_2O$, $C_3H_8$ or $C_4H_{10}$. If the driving material in the container containing driving material is a pressure liquidized gas, the volume is utilised more efficiently.

Also other alternatives for driving material are possible. In one embodiment, the driving material is a compound which exhibits an exothermic reaction and/or a volume expanding reaction when coming into contact with a catalytically active material. By providing catalytically active material at the heater microstructure, e.g. as the surface metal coating, the driving gas coming into contact with the heated catalytically active surface will exhibit a reaction, which results in an even increased temperature and/or an increased volume. Examples of possible catalytically active materials to use are Pd, Ir, Rh and Pt. In such a way, the driving material is utilised even more efficiently.

The catalytically active material is exposed not only to the intended driving material, but also to impurities in the gas and to high temperatures, and is therefore subject to e.g. corrosion and/or evaporation. In a further embodiment, the driving material could comprise very small amounts of compounds of catalytically active materials. When these compounds are exposed to the hot heater microstructure, they can decompose and the catalytically active material deposits onto the heater microstructure. In this way, new catalytically active material can continuously be provided to the heater microstructure surface. Preferably, the compounds of catalytically active materials are stored in a separate tank and are mixed together with the pure driving material when needed. If the wear situation of the heater microstructures are well known, it might also be possible to have a common storage of driving material and the compounds for the heater microstructure. A possible candidate for a driving gas is $Ni(CO)_4$.

Figure 6:
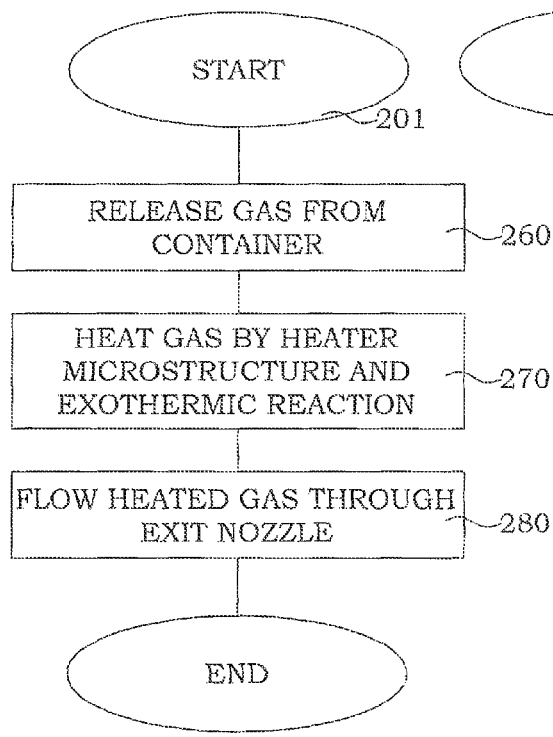
FIG. 6 is a flow diagram of main steps of an embodiment of an operating method according to the present invention.

FIG. 6 illustrates a flow diagram of main steps of an embodiment of a method for operating a gas thruster according to the present invention. The procedure starts in step 201, in step 260, gas comprising a compound exhibiting an exothermic reaction when coming into contact with a catalytically active material is released from a container. In step 270, the gas is heated. This heating is performed at least partly by a heater microstructure of silicon or a silicon compound having a surface metal coating of the catalytically active metal. The heating is also at least partly performed by the compound exothermically reacting at the surface metal coating. Finally, in step 280, the heated gas flows through an exit nozzle of the gas thruster, thereby giving rise to a force on the gas thruster in an opposite direction.

Figure 7:
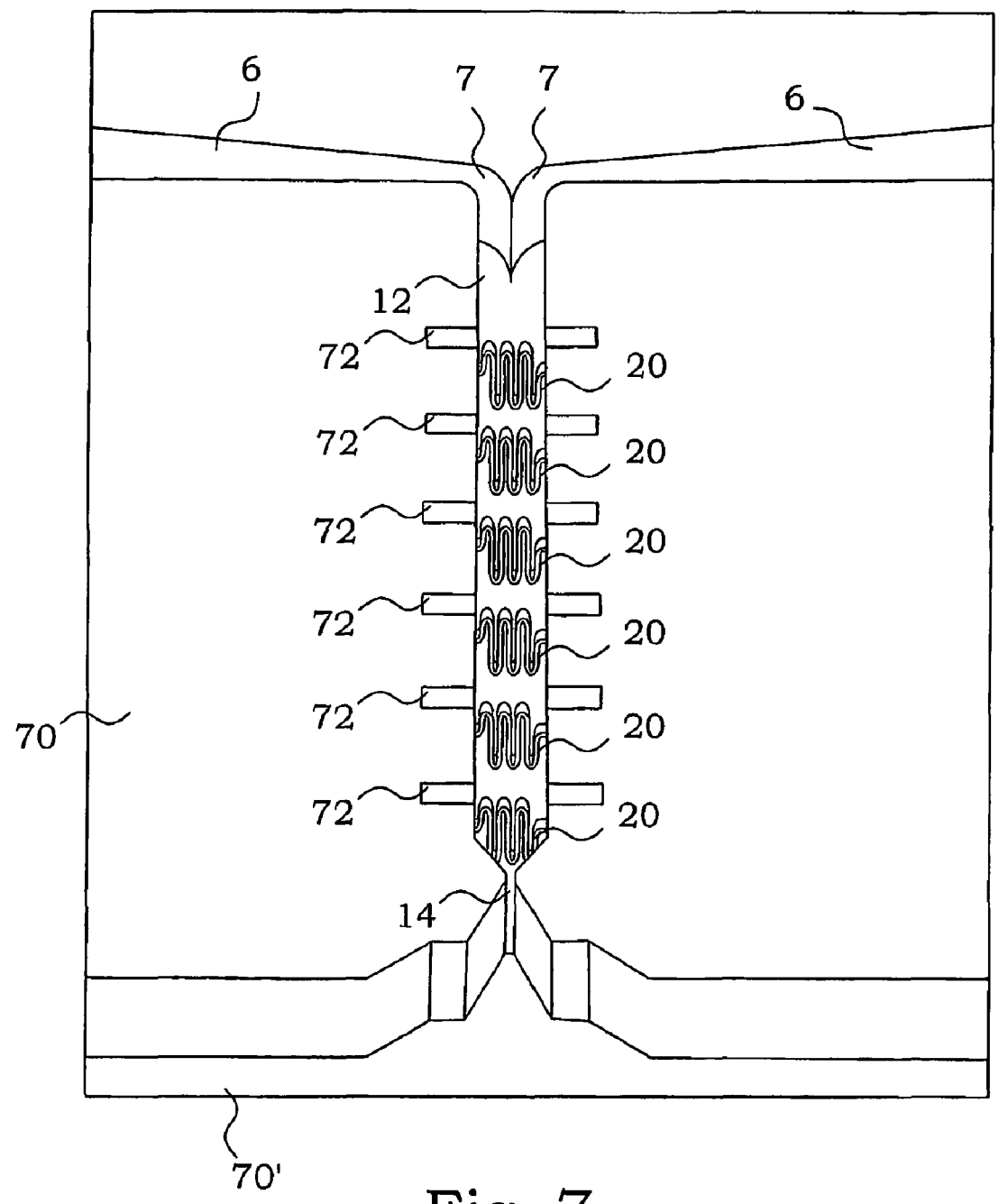
FIG. 7 is an elevational view of an embodiment of a stagnation chamber with mounted heater microstructures according to the present invention.

In FIG. 7, a test equipment of a stagnation chamber 12 with six heater microstructures 20 mounted in series is illustrated. The stagnation chamber is produced in a silicon wafer 70. The heater microstructures 20 are mounted into grooves 72 in the silicon wafer, where holes in an underlying silicon wafer 70' are provided for the electrical connections (not shown in this Fig.). In such a way, the electrical connection can be provided from the backside of the silicon wafer, external of the stagnation chamber.

Figure 8:
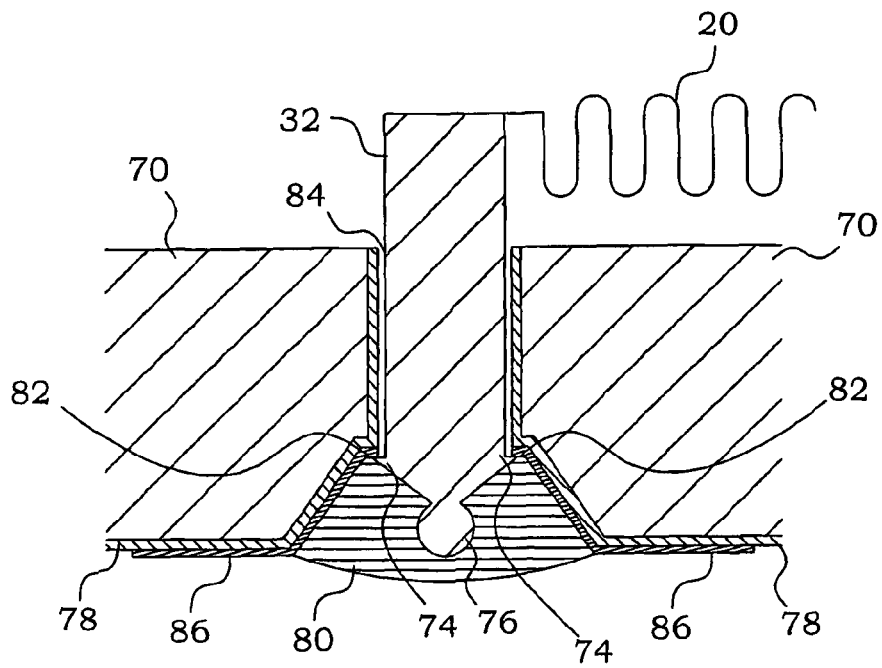
FIG. 8 is a schematic drawing illustrated a preferred embodiment for mechanical and electrical mounting of heater microstructures.

In a preferred embodiment, the electrical connection 32 of the heater microstructures 20 is designed as in FIG. 8. The electrical connection 32 has a general elongated form provided with small hooks 74 close to the bottom end. The general dimension of the electrical connection 32 is adapted to just fit into a hole 84 in the wafer 70. The edges of the hooks 74 are dimensioned for being slightly larger than the hole 84 dimension. In such a way, the electrical connection 32 can be forced through the hole 84, but when the hooks penetrates out from the hole, the edges prohibits the electric connections to be removed again. The edges of the hooks 74 rests against an edge 82 of the wafer at the exit of the hole 84. This ensures a mechanical stability.

The electric connection 32 is manufactured in low-resistance silicon and is therefore conducting. In order to prohibit any electrical contact with the silicon wafer 70, the inside surface 78 of the hole 84 as well as areas in the vicinity of the hole openings are oxidized, giving rise to a layer of insulating silicon oxide. At the lower orifice of the hole 84, the wafer is provided with a thin metal layer 86, having a vacuum tight adhesion to the silicon wafer 70. A solder material 80 is deposited over the end 76 of the electrical connection 32 and heated until the solder material 80 wets against the end 76 as well as against the thin metal layer 86. Preferably, the heating can be performed by sending an electric current through the thin metal layer 86. In such a way, both an electrical connection and a vacuum seal are provided in a simple way, without need for traditional soldering processes. The adhesion properties can be enhanced by shaping the end 76, e.g. as a sphere as shown in the figure, for providing a geometrical structure that provides enhanced strength to the adhesion to the end 76.

As seen in FIG. 8, the orifice of the hole at the bottom side is provided in a recess in the wafer. This makes it possible to contain the entire electrical connection within the main surface plane of the wafer, which reduces risks for mechanical damages.

The principles presented above concerning the electrical connection of the heater microstructure can be utilised in a more general manner as electrical vias. In prior art, electrical vias are typically provided by inserting a metal pin through a hole provided through a wafer. The pin is electrically connected at each side of the wafer. When the electrical structures become smaller and smaller, the handling of such vias becomes difficult, due to the small dimensions.

Furthermore, in many applications today, several wafers are provided on top of each other in a wafer stack, possibly bonded together. Electrical vias are often provided between different surfaces of these wafers. During the bonding process, the wafers are heated to high temperatures, which means that it is difficult to provide soldered vias before the bonding process. Furthermore, if metal vias are used the thermal expansion differs between the wafer and the vias. In particular for vias through multiwafer stacks, the difference in thermal expansion can be considerable, which leads to mechanical stress of the connections. This is particularly important, e.g. during bonding processes or other high temperature treatments.

The use of low-resistance silicon as vias solves many of these problems. The thermal expansion of the vias becomes identical to the thermal expansion of the wafer, which removes any mechanical strain upon heating the treatment. Furthermore, since the geometrical shape of silicon vias can be tailored with a very high accuracy, hooks or other retaining means can be provided to ensure mechanical connections. A few non-exclusive examples of vias are presented in the FIGS. 9A-C. However, anyone skilled in the art realises that there are many other variants and modifications of the same basic principles that are possible to utilize.

Figure 9A:
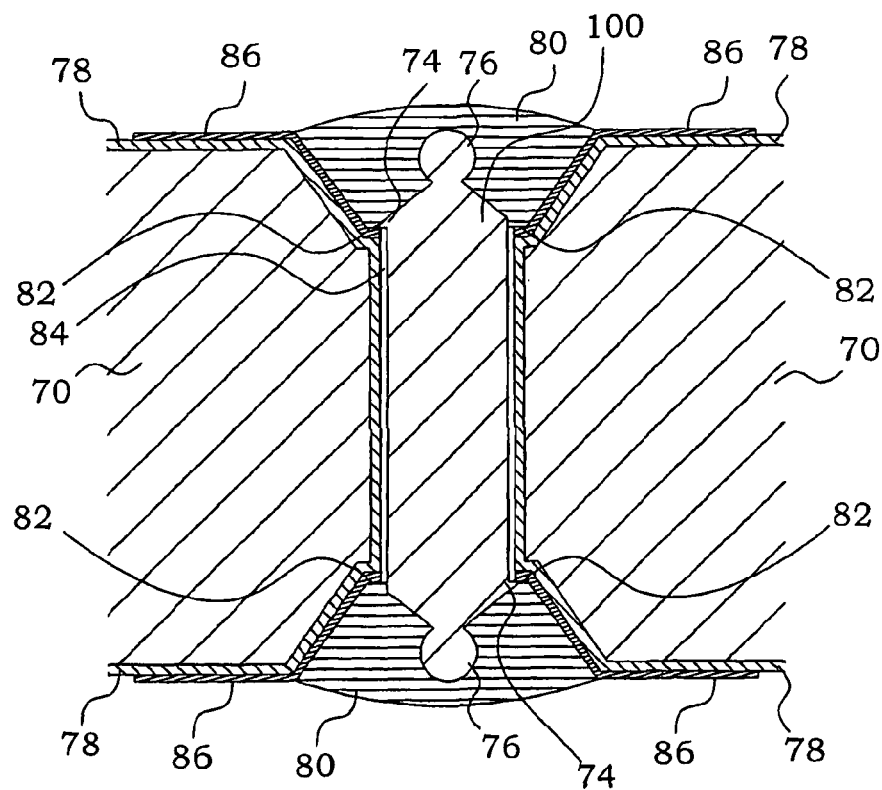
FIGS. 9A-C are schematic drawings illustrating the general use of silicon as electrical vias.

In FIG. 9A, a via 100 of low-resistance silicon is inserted through a hole 84 an a wafer 70. The via 100 has a hook 74 in the vicinity of each end 76 thereof. In this embodiment, there is only one hook at each end, which facilitates the insertion through the hole 84. The hole 84 is covered by a silicon oxide layer in order to prohibit electrical shortening towards the wafer 70. At each orifice of the hole 84, the wafer presents a recess, in which an edge 82 is provided, against which the hook 74 is intended to rest. The recess and an area around the recess is also covered by a metal film 86 assisting in ensuring a good adhesion and a vacuum tight seal. The metal film 86 can also be used for heating the solder material when creating the solder, as well as an electrical lead to the via 100 for operational purposes.

Figure 9B:
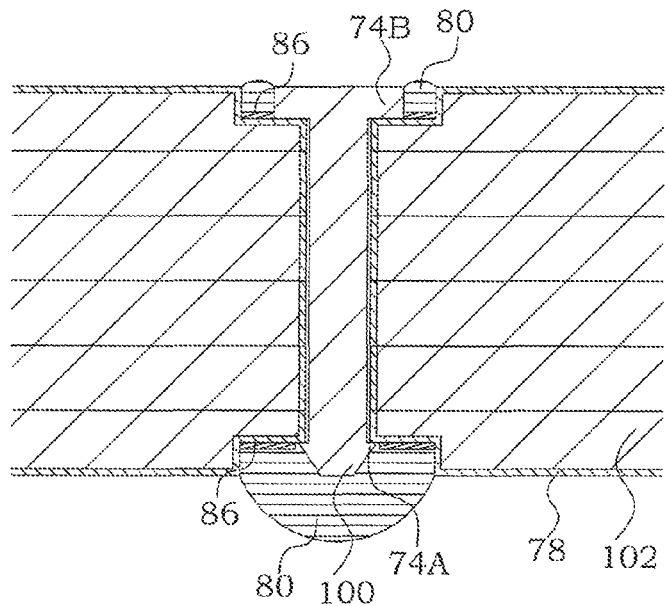

In FIG. 9B, the via 100 is inserted through a multiwafer stack 102. In this embodiment, the retaining structures 74A at one end are small enough to be forced through the hole 84. However, the retaining structures 74B at the other end are larger, ensuring an even more safe mechanical mounting.

Figure 9C:
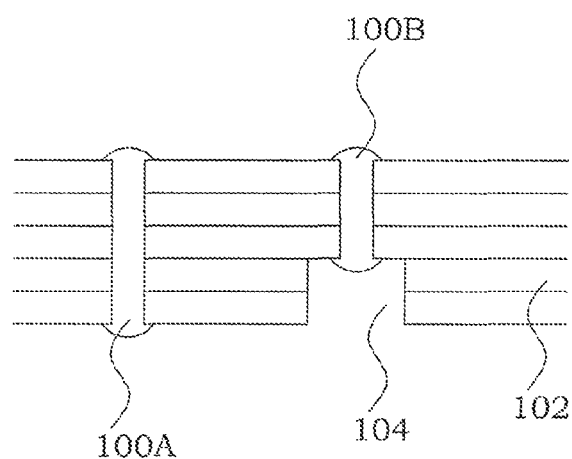

In FIG. 9C, a stack of wafers is shown in cross section. A first via 100A is provided through the entire stack, while a second via 100B only passes through three of the wafers. One end of the second via 100B thus ends within the stack. The solder material for this can be provided through a hole 104, and the final soldering process can be provided by using the metallisation around the via hole 84. It is thus easy to provide vias between arbitrary planes of the wafer stack by using the present principles.

The embodiments described above are to be understood as a few illustrative examples of the present invention. It will be understood by those skilled in the art that various modifications, combinations and changes may be made to the embodiments without departing from the scope of the present invention. In particular, different part solutions in the different embodiments can be combined in other configurations, where technically possible. The scope of the present invention is, however, defined by the appended claims.

The invention claimed is:

1. A method for manufacturing a nozzle arrangement for use in a gas thruster, comprising the steps of:
   providing a stagnation chamber having an entrance opening and a nozzle exit;
   manufacturing a heater microstructure core in silicon or a silicon compound;
   covering a surface of said heater microstructure core with a surface metal or metal compound coating;
   said step of covering in turn comprising the steps of:
   heating said heater microstructure core by conducting an electric current therethrough;
   flowing a gas comprising a metal compound over said heater microstructure core; and
   decomposing said compound at the heated heater microstructure core into said metal or metal compound; and
   mounting said heater microstructure in said stagnation chamber.

2. The method according to claim 1, wherein said step of mounting is performed prior to said step of covering, whereby said step of covering is performed in situ in said stagnation chamber.

3. The method according to claim 1, wherein said step of covering comprises the further steps of:
   monitoring a resistance over said heater microstructure;
   and interrupting at least one of said step of heating and said step of flowing, whereby an in-situ resistance tuning is achieved.

4. The method according to claim 1, comprising the further step of etching away at least a part of said silicon or silicon compound.

5. A method for in-situ repairing of a nozzle arrangement for use in a gas thruster, said nozzle arrangement comprising at least one heater microstructure, composed of silicon or silicon compound with a surface metal or metal compound coating, and arranged in a stagnation chamber, said method comprising the step of:
   repairing said heater microstructure by improving said surface metal or metal compound coating;
   said step of repairing in turn comprising the steps of:
   heating said heater microstructure by conducting an electric current therethrough;
   flowing a gas comprising a metal compound comprising said surface metal or metal compound over said heater microstructure; and
   decomposing said metal compound at the heated heater microstructure into said surface metal or metal compound.

6. The method according to claim 5, wherein said gas used in said step of flowing a gas is further used for driving said gas thruster.

* * * * *

UNITED STATES PATENT AND TRADEMARK OFFICE
CERTIFICATE OF CORRECTION

| | | |
|---|---|---|
| PATENT NO. | : 8,336,314 B2 | Page 1 of 1 |
| APPLICATION NO. | : 12/439749 | |
| DATED | : December 25, 2012 | |
| INVENTOR(S) | : Tor-Arne Gronland et al. | |

It is certified that error appears in the above-identified patent and that said Letters Patent is hereby corrected as shown below:

On the title page, Item (75), please amend the second inventor's family name to read as follows:
        -- Pelle RANGSTEN, Storvreta (SE) --

Signed and Sealed this
Fifth Day of March, 2013

Teresa Stanek Rea
*Acting Director of the United States Patent and Trademark Office*